(12) United States Patent
Hou et al.

(10) Patent No.: US 11,343,923 B2
(45) Date of Patent: May 24, 2022

(54) SCREEN SUPPORTING DEVICE AND FOLDABLE FLEXIBLE DISPLAY DEVICE

(71) Applicant: Yungu (Gu'an) Technology Co., Ltd., Langfang (CN)

(72) Inventors: Hongqi Hou, Langfang (CN); Yongfeng Zhao, Langfang (CN); Fu Liao, Langfang (CN); Liwei Ding, Langfang (CN); Xuebin Li, Langfang (CN); Zhaoji Zhu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 31 days.

(21) Appl. No.: 16/866,711

(22) Filed: May 5, 2020

(65) Prior Publication Data

US 2020/0267851 A1    Aug. 20, 2020

Related U.S. Application Data

(63) Continuation of application No. PCT/CN2019/072352, filed on Jan. 18, 2019.

(30) Foreign Application Priority Data

Sep. 19, 2018  (CN) .......................... 201821535784.8

(51) Int. Cl.
*H05K 5/00* (2006.01)
*H05K 1/18* (2006.01)
*H05K 5/02* (2006.01)

(52) U.S. Cl.
CPC ........... *H05K 5/0017* (2013.01); *H05K 1/189* (2013.01); *H05K 5/0086* (2013.01); *H05K 5/0226* (2013.01)

(58) Field of Classification Search
CPC .... H05K 5/0017; H05K 1/198; H05K 5/0086; H05K 5/0226
(Continued)

(56) References Cited

U.S. PATENT DOCUMENTS 9,348,450 B1    5/2016  Kim
9,874,048 B1    1/2018  Hsu
(Continued)

FOREIGN PATENT DOCUMENTS

CN    103927940 A    7/2014
CN    105491193 A    4/2016
(Continued)

OTHER PUBLICATIONS

PCT International Search Report of PCT/CN2019/072352 dated Jun. 24, 2019 and an English Translation.
(Continued)

*Primary Examiner* — Stanley Tso
(74) *Attorney, Agent, or Firm* — Ladas & Parry LLP (57) ABSTRACT

A screen supporting device includes: a drive component and a supporting component rotationally connected to the drive component. The drive component comprises a rotating shaft and a connecting rod that rotationally connected to the rotating shaft. The drive component and the supporting component are disposed in a non-display surface of the flexible display screen. The connecting rod is fixedly connected to the supporting component. Through the rotating connection between the rotating shaft and the connecting rod, the supporting component and the drive component relatively rotate and move away from each other to fold or expand the flexible display screen.

14 Claims, 6 Drawing Sheets

(58) Field of Classification Search
USPC .......................................................... 361/749
See application file for complete search history.

(56) References Cited

U.S. PATENT DOCUMENTS

| | | | |
|---|---|---|---|
| 10,352,354 B1* | 7/2019 | Hsu ........................ | G06F 1/1652 |
| 2017/0115701 A1* | 4/2017 | Bae ........................... | G06F 1/16 |
| 2018/0217639 A1* | 8/2018 | Jones .................... | G06F 1/1652 |

FOREIGN PATENT DOCUMENTS

| | | |
|---|---|---|
| CN | 106601130 A | 4/2017 |
| CN | 206282175 U | 6/2017 |
| CN | 107731100 A | 2/2018 |
| CN | 107833522 A | 3/2018 |
| CN | 108520701 A | 9/2018 |
| WO | 2017/051788 A1 | 3/2017 |
| WO | 2017/211115 A1 | 12/2017 |

OTHER PUBLICATIONS

PCT Written Opinion of PCT/CN2019/072352 dated Jun. 24, 2019 and an English Translation.
European Search Result in Application No. 19863620.1 dated Apr. 13, 2021.
Japanese Notice of Reasons for Refusal in Application No. 2020-542777 dated Jul. 20, 2021.

* cited by examiner

SCREEN SUPPORTING DEVICE AND FOLDABLE FLEXIBLE DISPLAY DEVICE

CROSS-REFERENCE TO RELATED APPLICATIONS

This application is a continuation of International Application No. PCT/CN2019/072352 filed on Jan. 18, 2019, which claims priority to Chinese patent application No. 201821535784.8 filed on Sep. 19, 2018. Both applications are incorporated herein by reference in their entireties.

TECHNICAL FIELD

Embodiments of the present application relate to the field of display technology, and in particular to a screen supporting device and a foldable flexible display device.

BACKGROUND

At present, due to a foldable advantage of a flexible display screen, terminal products such as mobile phones and tablet computers using flexible display screens are moving towards a foldable direction. A foldable display device in the prior art may be folded, but it is easy to form a crease in a folded area. After a plurality of folding operations, the crease is liable to be cracked or even broken, resulting in poor display effect and other phenomena, which make the flexible display screen unable to display normally.

SUMMARY

In view of the above, embodiments of the present application provide a screen supporting device and a foldable flexible display device. Problem, that a crease resulting in display failure which is easy to form on a folded area of a foldable display screen in the prior art, is solved.

According to one aspect of the application, an embodiment of the application provides a screen supporting device. The screen supporting device includes: a drive component and a supporting component rotationally connected to the drive component. The drive component includes a rotating shaft and a connecting rod rotationally connected to the rotating shaft. The drive component and the supporting component are disposed in a non-display surface of the flexible display screen; the connecting rod is fixedly connected to the supporting component; and through the rotating connection between the rotating shaft and the connecting rod, the supporting component and the drive component relatively rotate and move away from each other to fold or expand the flexible display screen.

In an embodiment of the present application, the drive component further includes: a fixing member and a rotating member. The fixing member is fixedly connected to the connecting rod. The rotating member is rotationally connected to the rotating shaft. The supporting component and the drive component relatively rotate and move away from each other to fold or expand the flexible display panel includes: the connecting rod drives the fixing member to move under an action of the rotating shaft, and a movement of the fixing member results in that the supporting component rotates around and moves away from the drive component.

In an embodiment of the present application, a slide way is set on the supporting component and the rotating member is disposed in the slide way and slides along the slide way.

In an embodiment of the present application, a sliding groove is set on a side of the fixing member.

In an embodiment of the present application, the drive component further includes a folded component fixedly connected to the rotating shaft. The folded component is disposed in the sliding groove, and the folded component slides along the sliding groove.

In an embodiment of the present application, the folded component includes: a lateral sliding supporting plate, a rotating supporting plate and a panel fixed supporting plate. An end of the rotating supporting plate is rotationally connected to the lateral sliding supporting plate, and an other end of the rotating supporting plate is rotationally connected to the panel fixed supporting plate. The lateral sliding supporting plate is disposed in the fixing member, and the lateral sliding supporting plate slides along the sliding groove.

In an embodiment of the present application, the sliding groove is a linear sliding groove.

In an embodiment of the present application, an angle between an extension direction of the sliding groove and a plane of the flexible display panel is greater than zero degree and less than ninety degrees.

In an embodiment of the present application, the fixing member includes two sliding grooves, and the two sliding grooves are parallel to each other.

In an embodiment of the present application, the drive component further includes a shaft locking member fixedly connected to the rotating shaft.

In an embodiment of the present application, the rotating shaft includes a first rotating shaft and a second rotating shaft, which are arranged in parallel, the drive component includes a first connecting rod rotationally connected to the first rotating shaft and a second connecting rod rotationally connected to the second rotating shaft, a worm gear structure is disposed between the first rotating shaft and the second rotating shaft, and the first rotating shaft and the second rotating shaft are respectively connected to the worm gear structure.

According to another aspect of the application, an embodiment of the application provides a foldable flexible display device. The foldable flexible display device includes a flexible display screen for realizing display function and a screen supporting device for the flexible display screen. A structure of the screen supporting device adopts the structure of any one of the above-mentioned screen supporting devices.

In an embodiment of the present application, the flexible display screen includes a circuit board. The circuit board is disposed inside the supporting component and configured to provide a driving circuit required by the flexible display screen.

In an embodiment of the present application, the circuit board includes a flexible circuit board.

In an embodiment of the present application, the flexible display screen includes a battery. The battery is disposed inside the supporting component and configured to provide power required by the circuit board.

In an embodiment of the present application, the battery includes a flexible battery.

The embodiments of the present application provide a screen supporting device and a foldable flexible display device. The screen supporting device includes a drive component, which is used for supporting a part of the flexible display screen. The drive component includes a rotating shaft and a connecting rod. During a process of folding the flexible display screen from an unfolded state to a folded state, the supporting component rotates around the drive component and moves away from the drive component under an action of the rotating shaft and the connecting rod. So that, in the folding process, there is sufficient accommodate space for the bending part of the flexible display screen. Thus occurrence of a crease is avoided, and display failure of the flexible display screen is avoided further.

DETAILED DESCRIPTION OF THE EMBODIMENTS

In the following detailed description of the preferred embodiments, reference will be made to the accompanying figures which form a part of the present application. The accompanying figures show, by way of example, specific embodiments that can implement the present application. The exemplary embodiments are not intended to be exhaustive of all embodiments according to the present application. It should be understood that other embodiments may be used and structural or logical modifications may be made without departing from the scope of the present application. Therefore, the following detailed description is not restrictive, and the scope of the present application is defined by the appended claims.

Embodiments of the present application provide a screen supporting device, which is used for supporting a flexible display screen. The screen supporting device may be directly used in a display device as a part of the display device, or may be used alone as a supporting device to supporting a flexible display screen. The display device including the screen supporting device may be used as an independent device and a subordinate device. The screen support device makes the display device foldable. For example, the display device may be a mobile phone, a wristwatch, a computer, a tablet computer and other terminal that has a display function.

Figure 1:
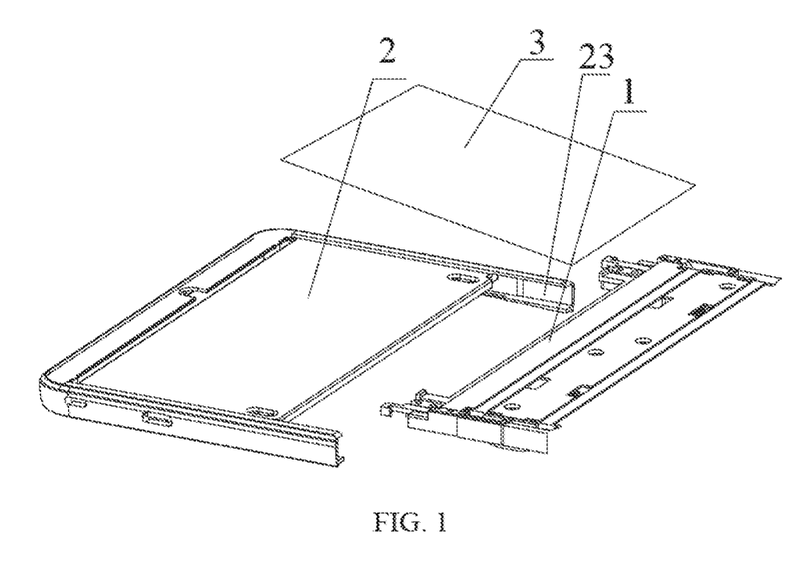
FIG. 1 is a schematic structural diagram of a screen supporting device according to an embodiment of the present application.
Figure 2:
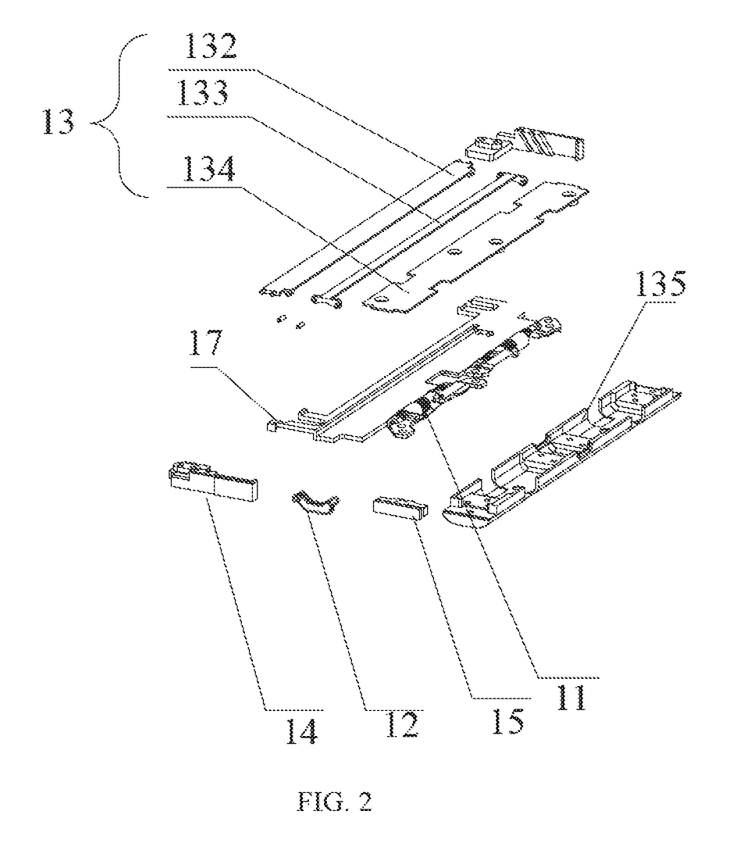
FIG. 2 is a diagram illustrating of a drive component in a screen supporting device according to an embodiment of the present application.

FIG. 1 is a schematic structural diagram of a screen supporting device according to an embodiment of the present application. As shown in FIG. 1, the screen supporting device includes a drive component 1 and a supporting component 2. The supporting component 2 is connected to the drive component 1. The drive component 1 and the supporting component 2 are disposed in a non-display surface of the flexible display screen 3. The supporting component 2 supports a bending part of the flexible display screen 3. The bending part refers to a bending area of the flexible display screen 3 when folding the flexible display screen 3. As shown in FIG. 2, the drive component 1 includes a rotating shaft 11 and a connecting rod 12 rotationally connected to the rotating shaft 11. During a process of folding the flexible display screen from an unfolded state to a folded state, the supporting component 2 rotates around the drive component 1 and moves away from the drive component 1 at the same time. In the process of folding the flexible display device, a certain accommodation space for the bending part of the flexible display screen can be formed by the screen supporting device. Therefore, the bending part of the flexible display screen is not a crease, and problem of display failure caused by creases at the bending part of the flexible display screen can be avoided.

In an embodiment of the present application, the drive component 1 further includes: a fixing member 14 and a rotating member 17. The rotating member 17 is rotationally connected to the rotating shaft 11. The fixing member 14 is fixedly connected to the connecting rod 12. As shown in FIG. 2, during the process of folding the flexible display screen from an unfolded state to a folded state, the rotating shaft 11 rotates. The rotation of the rotating shaft 11 drives the connecting rod 12 to move. The movement of the connecting rod 12 drives the fixing member 14 to move. At the same time, the rotation of the rotating shaft 11 also drives the rotating member 17 to move, so that the rotating member 17 slides relatively to the fixing member 14. That is to say, the rotating member 17 rotates and slides relatively to the fixing member 14 at the same time. Since the rotating member 17 is fixedly connected to the supporting component 2, the rotating member 17 can drive the supporting component 2 to rotate around the rotating shaft 11 and away from the rotating shaft 11 at the same time, so as to realize that the supporting component 2 rotates around the drive component 1 and moves away from the drive component 1. In the process of folding the flexible display device, a certain accommodation space for the bending part of the flexible display screen is formed by the screen supporting device. Therefore, display failure caused by creases at the bending part of the flexible display screen is avoided.

In an embodiment of the present application, as shown in FIG. 1, a slide way 23 is set on the supporting component 2. The rotating member 17 is disposed in the slide way 23, and the rotating member 17 can slide along the slide way 23.

Figure 3:
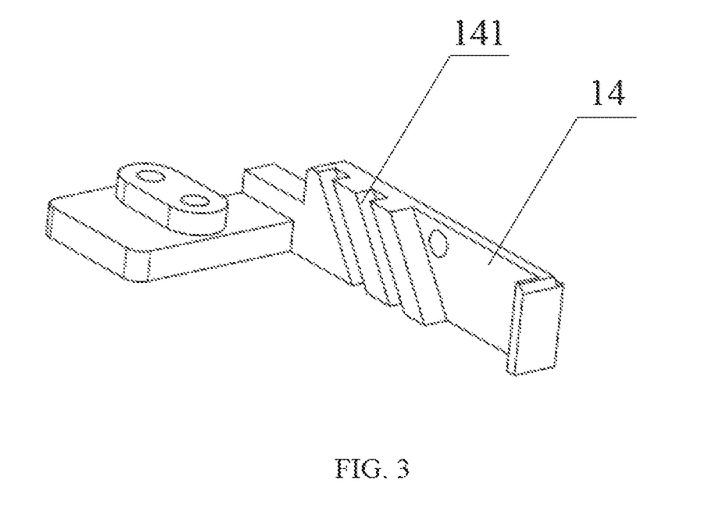
FIG. 3 is a diagram illustrating of a fixing member in a screen supporting device according to an embodiment of the present application.

In an embodiment of the present application, a sliding groove 141 is set on a side of the fixing member 14, as shown in FIG. 3. The drive component 1 further includes a folded component 13, as shown in FIG. 2, the folded component 13 is disposed on the sliding groove 141, and the folded component 13 can slides along the sliding groove 141. During the process of folding the flexible display screen from an unfolded state to a folded state, the folded component 13 slides along the sliding groove 141. When the supporting component 2 moves away from the drive component 1, a movement of the folded component 13 can form an accommodation space for the bending part of the flexible display screen, the bending part is supported by the drive component 1.

In an embodiment of the present application, the folded component 13 further includes: a lateral sliding supporting plate 132, a rotating supporting plate 133 and a panel fixed supporting plate 134. As shown in FIG. 2, the rotating supporting plate 133 is rotationally connected to the lateral sliding supporting plate 132, the panel fixed supporting plate 134 is rotationally connected to the rotating supporting plate 133, and the panel fixed supporting plate 134 is fixed on the rotating shaft supporting base 135. During the process of folding the flexible display screen from an unfolded state to a folded state, the lateral sliding supporting plate 132 slides along the sliding groove 141 on the fixing member 14. The sliding movement of the lateral sliding supporting plate 132 drives the rotating supporting plate 133 to rotate around the lateral sliding supporting plate 132, and a rotation direction of the rotating supporting plate 133 is opposite to a folding direction of the flexible display screen. Therefore, when the supporting component 2 moves away from the drive component 1, an accommodation space for the bending part of the flexible display screen supported by the drive component 1 can be formed by movement of the rotating supporting plate 133. So that there is the accommodation space for the bending part of the flexible display screen during the process of folding the flexible display device. Therefore, during the process of folding the flexible display device, the problem of display failure, which is caused by creases in the bending part of the flexible display screen, is avoided.

In an embodiment of the present application, the sliding groove 141 is a linear sliding groove, and an angle between an extension direction of the sliding groove 141 and a plane of the flexible display screen 3 is greater than zero degree and less than ninety degrees. By setting the extension direction of the linear sliding groove 141 in this way, it is ensured that the lateral sliding supporting plate 132 slides within the sliding groove 141 while rotating around the rotating supporting plate 133.

In an embodiment of the present application, the fixing member 14 includes two sliding grooves 141 which are parallel to each other. By setting two sliding grooves 141, it is ensured that the lateral sliding supporting plate 132 slides within the fixed part 14 at a limited position when the lateral sliding supporting plate 132 rotates around the rotating supporting plate 133.

It should be understood that, in embodiments of this application, a shape of the sliding groove, a number of the sliding grooves set on the fixing member 14 and a position relationship between the sliding grooves all can be selected according to requirements of the actual application scenarios. As long as the selected shape of the sliding groove can satisfy that a sliding and a limit of the lateral sliding supporting plate 132 in the sliding groove, those described herein are not limited.

In an embodiment of the present application, a shaft locking member 15 is set on the rotating shaft 11, as shown in FIG. 2. The shaft locking member 15 is set at an end of the rotating shaft 11, and when the flexible display device needs to be fixed in a certain state, the shaft locking member 15 is used to fix the rotating shaft 11 in a desired state. It should be understood that, in the embodiments of this present application, the desired state to be fixed may be any of a folded state, an unfolded state and any state in the process from the folded state to the unfolded state, and the desired state to be fixed is not limit in the embodiments of the present application.

Figure 4:
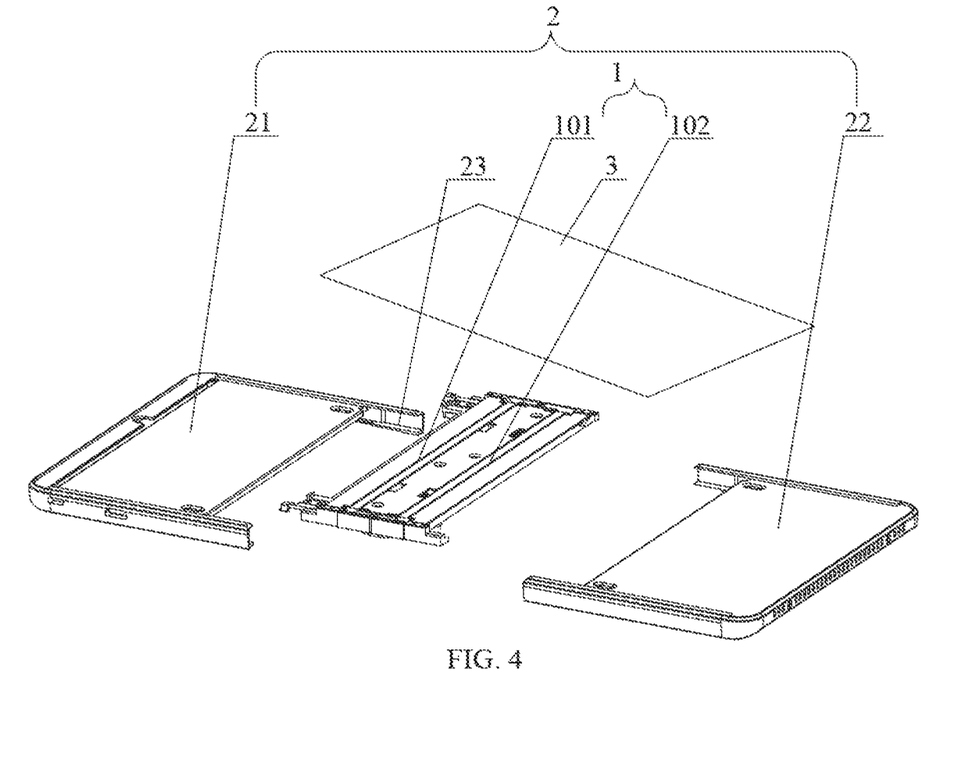
FIG. 4 is a schematic structural diagram of another screen supporting device according to an embodiment of the present application.
Figure 5:
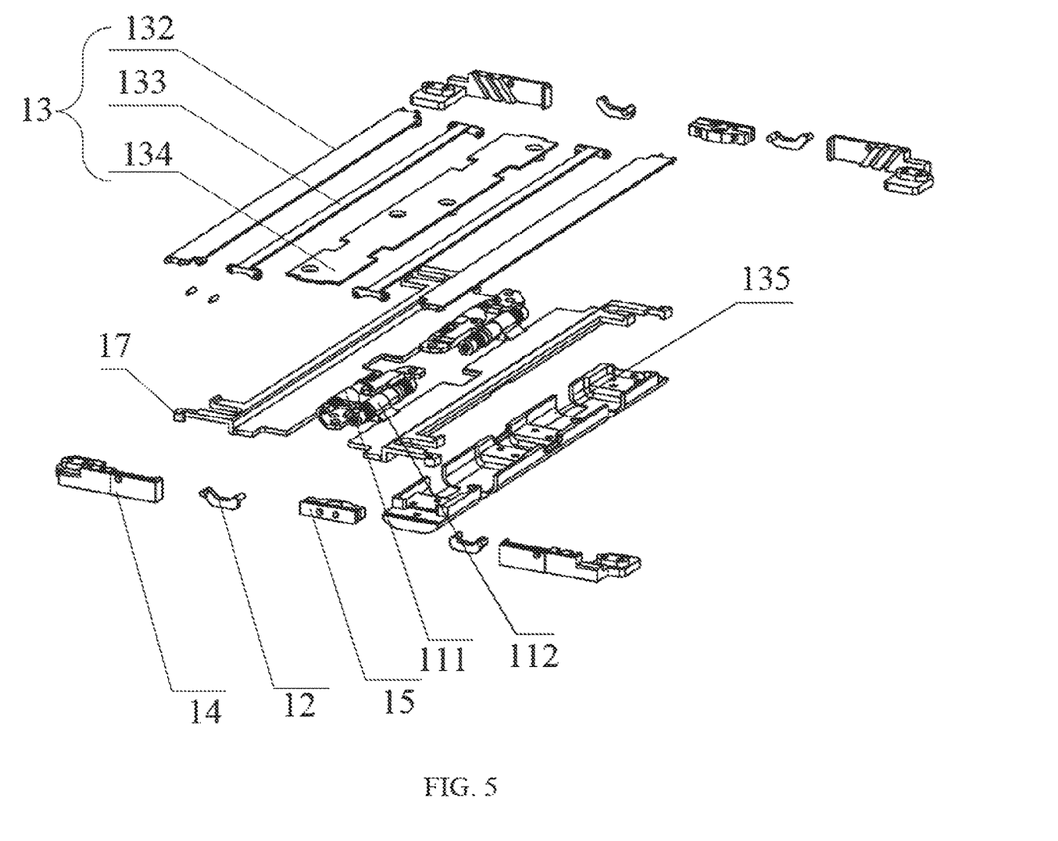
FIG. 5 is a diagram illustrating of a drive component in another screen supporting device according to an embodiment of the present application.

In an embodiment of the present application, the screen supporting device includes: two drive components 1, i.e., a first drive component 101 and a second drive component 102, which are fixedly connected to each other. As shown in FIG. 4, the first drive component 101 is configured to supporting a first part of the flexible display screen 3, and the second drive component 102 is configured to supporting a second part of the flexible display screen 3. As shown in FIG. 5, the first drive component 101 includes a first rotating shaft 111, and the second drive component 102 includes a second rotating shaft 112. The first rotating shaft 111 is fixedly connected to the second rotating shaft 112, so as to realizing the relative fixedly connection between the first drive component 101 and the second drive component 102. A structure of the first rotating shaft 111 and/or a structure of the second rotating shaft 112 are the same as the structure of the above-mentioned rotating shaft 11. As shown in FIG. 4, the screen supporting device also includes two supporting components 2, i.e., the first supporting component 21 and the second supporting component 22. The first supporting component 21 is disposed on a side of the first drive component 101, and the second supporting component 22 is disposed on a side of the second drive component 102. During the process of folding the flexible display screen from an unfolded state to a folded state, the first supporting component 21 rotates around the drive component 101 and moves away from the drive component 101, and at the same time the second supporting component 22 rotates around the second drive component 102 and moves away from the second drive component 102. A direction in which the first supporting component 21 moves away from the first drive component 101 is opposite to a direction in which the second supporting component 22 moves away from the second drive component 102, i.e., the two supporting components moves away from each other, so that there will be more accommodation space for the bending part of the flexible display screen. Therefore, during the process of folding the flexible display device, the problem of display failure, caused by creases in the bending part of the flexible display screen, is avoided.

In an embodiment of the present application, the first rotating shaft 111 and the second rotating shaft 112 are connected through a worm gear structure. The worm gear structure is used to link the two rotating shafts to realize the synchronous rotation of the two rotating shafts. Thereby efficiency of folding process and unfolding process are further improved.

It should be understood that, in embodiments of this application, transmission structure can be selected according to requirements of the actual application scenarios to realize the rotation transmission between the first rotating shaft 111 and the second rotating shaft 112, such as a gear structure or a rack structure. The transmission structure connecting the two rotating shafts in the embodiment of this application includes but is not limited to the worm structure.

It should be understood that the internal structure of the first drive component 101 and the second drive component 102, how does the second drive component 102 make the second supporting component 22 rotate and move away from the second drive component 102, and how does the first drive component 101 make the first supporting component 21 rotate and move away from the first drive component 101, which are not described herein, are as described above.

It should also be understood that a number of the supporting components 2, a number of the drive components 1 and a number of drive components 1 between two adjacent supporting components 2 included in the screen supporting device can be selected according to requirements of the actual application scenarios. For example, when a flexible display screen supported by a screen supporting device has two bending places, the screen supporting device can include three supporting components and four or two drive components. Two adjacent supporting components may be connected by one drive component or two drive components, as long as the supporting components and the drive components can cooperate with each other to ensure that creases can be avoid in the folding process of the flexible display screen. The number of supporting components 2, the number of drive components 1 and the number of drive components 1 between the adjacent two supporting components 2, included in the screen supporting device, are not limited in embodiments of the present application.

Figure 6:
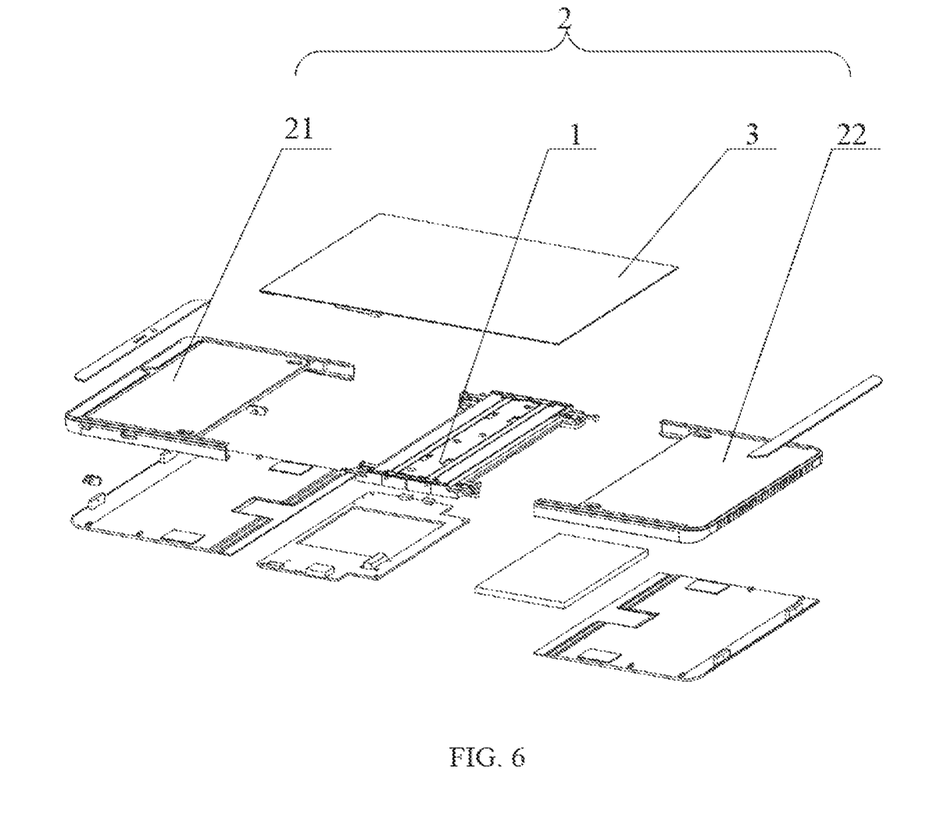
FIG. 6 is a schematic structural diagram of a foldable flexible display device according to an embodiment of the present application.

Embodiments of the present application also provide a foldable flexible display device. As shown in FIG. 6, the foldable flexible display device includes a flexible display screen 3, a screen supporting device for the flexible display screen 3. The flexible display screen 3 includes a first part, a second part and a bending part between the first part and the second part. The screen supporting device for the flexible display screen 3 includes a first supporting component 21, a second supporting component 22 and a drive component 1 between the first supporting component 21 and the second supporting component 22. The first supporting component 21 is configured to support and fix the first part of the flexible display screen, and the second supporting component 22 is configured to support and fix the second part of the flexible display screen. The drive component 1 supports the bending part of the flexible display screen 3. As shown in FIG. 2, the drive component 1 includes a rotating shaft 11, a connecting rod 12, a folded component 13, a fixing member 14 and a rotating member 17. The connecting rod 12 is fixedly connected to the fixed part 14 and the rotating shaft 11. A sliding groove 141 is set on a side of the fixing member 14, as shown in FIG. 3. The folded component 13 includes a lateral sliding supporting plate 132, a rotating supporting plate 133 and a panel fixed supporting plate 134. The lateral sliding supporting plate 132 is rotationally connected to the rotating supporting plate 133; the rotating supporting plate 133 is rotationally connected to the panel fixed supporting plate 134; and the lateral sliding supporting plate 132 can slide along the sliding groove of the fixing member 14. During the process of folding the flexible display screen from an unfolded state to a folded state, the rotating shaft 11 rotates under the action of external force, the rotation of the rotating shaft 11 drives the connecting rod 12 to move, and the movement of the connecting rod 12 drives the fixing member 14 to move. At the same time, the rotation of the rotating shaft 11 also drives of the rotating member 17 to rotate, the rotating member 17 slides relatively along the fixing member 14, i.e., when the rotating member 17 rotates, it slides relatively to the fixing member 14 at the same time. Since the rotating member 17 is fixedly connected to the first supporting component 21, the rotating member 17 can drive the first supporting component 21 to rotate around the rotating shaft 11 and move away from the rotating shaft 11 at the same time, so as to realizing that the first supporting component 21 rotates around the drive component 1 and moves away from the drive component 1, further realizing that the first supporting component 21 rotates around the second supporting component 22 and moves away from the second supporting component 22. More accommodation space is formed for the bending part of the flexible display screen. Therefore, during the process of folding the flexible display device, the problem of display failure, caused by creases in the bending part of the flexible display screen, is avoided.

In a further embodiment, as shown in FIG. 6, the foldable flexible display device includes two drive components 1, i.e., a first drive component 101 and a second drive component 102, which are fixedly connected to each other. As shown in FIG. 4, the first supporting component 21 is connected to the first drive component 101, the second supporting component 22 is connected to the second drive component 102, and the first drive component 101 is connected to the second drive component 102. Each of the first drive component 101 and the second drive component 102 includes a rotating shaft 11, a connecting rod 12, a folded component 13, a fixing member 14 and a rotating member 17. The connecting rod 12 is fixedly connected to the fixed part 14 and the rotating shaft 11, as shown in FIG. 2. A sliding groove 141 is set on a side of the fixing member 14, as shown in FIG. 3. The folded component 13 includes a lateral sliding supporting plate 132, a rotating supporting plate 133 and a panel fixed supporting plate 134. The lateral sliding supporting plate 132 is rotationally connected to the rotating supporting plate 133; the rotating supporting plate 133 is rotationally connected to the panel fixed supporting plate 134; and the lateral sliding supporting plate 132 can slide along the sliding groove of the fixing member 14. During the process of folding the flexible display screen from an unfolded state to a folded state, the first supporting component 21 and the second supporting component 22 fold in opposite directions at the same time, i.e., the first supporting component 21 and the second supporting component 22 are folded face to face. Since the first supporting component 21 is folded in the opposite direction to the second supporting component 22, the first drive component 101 drives the first supporting component 21 to rotate and move away from the first drive component 101, and the second drive component 102 drives the second supporting component 22 to rotate and move away from the second drive component 102. Therefore, the first supporting component 21 moves away from the second supporting component 22 to provide more accommodation space for the bending part of the flexible display screen. Therefore, during the process of folding the flexible display device, the problem, that the bending part of the flexible display screen becomes creased resulting in display failure of the flexible display screen, is avoided. The implementation way that how does the first drive component 101 make the first supporting component 21 rotate and move away from the first drive component 101 and how does the second drive component 102 make the second supporting component 22 rotate and move away from the second drive component 102 are as described above and will not be described herein.

Figure 7:
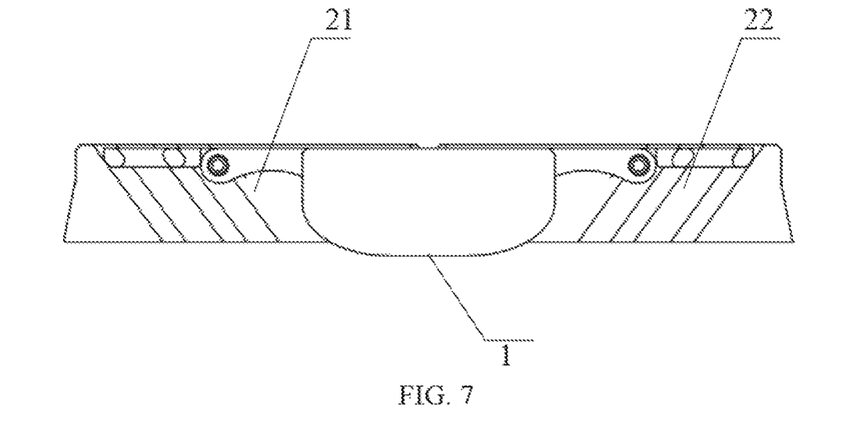
FIG. 7 is a schematic structural diagram of a foldable flexible display device in an unfolded state according to an embodiment of the present application.
Figure 8:
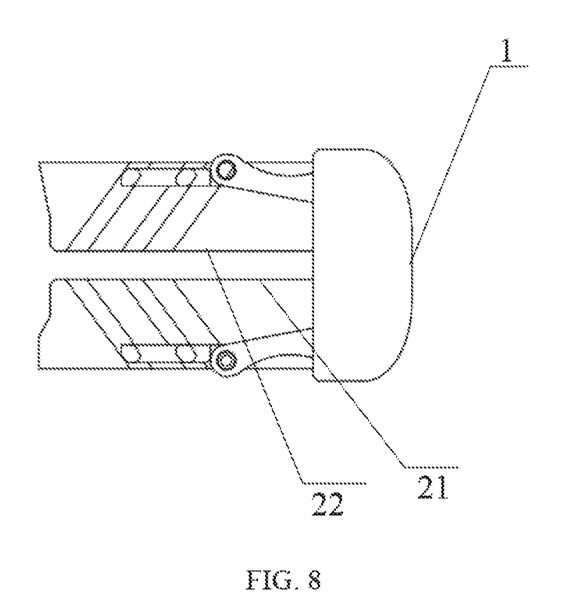
FIG. 8 is a schematic structural diagram of a foldable flexible display device in a folded state according to an embodiment of the present application.

As shown in FIG. 7, when the flexible display screen is in the unfold state, the first supporting component 21, the second supporting component 22 and the two drive components are under the flexible display screen, and they jointly supporting and fix with the first part, the second part and the bending part of the flexible display screen. When the flexible display screen is in the fold state, the first supporting component 21 is far away from the second supporting component 22, and the folded structure of the flexible display device is shown in FIG. 8.

In an embodiment of the present application, the flexible display screen further includes a circuit board. The circuit board is disposed inside the supporting component 2. The circuit board is configured to provide a driving circuit required by the flexible display screen. It should be understood that the position, where the circuit board is placed, can be selected according to the requirements of the actual application scenario (such as the internal capacity of the supporting component, etc.) in embodiments of this application, and the position of the circuit board is not limited in embodiments of this application.

In a further embodiment of the present application, the circuit board is a flexible circuit board. Since the flexible circuit board has a characteristic of bending, the circuit board may be disposed at the drive component in one embodiment.

In a further embodiment of the present application, the flexible display screen may further include a battery. The battery is disposed inside the supporting component 2. The battery is configured to provide power required by the circuit board. It should be understood that the position, where the battery is placed, can be selected according to the requirements of the actual application scenario (such as the internal capacity size of the supporting component 2, etc.) in embodiments of this application, and the position of the battery is not limited in embodiments of this application.

In a further embodiment of the present application, the battery is a flexible battery. Since the flexible battery has bending performance, the battery can be disposed at the drive component in one embodiment. Therefore, although the application is described with reference to specific embodiments, which are only intended to be exemplary, rather than limiting the scope of the application, it is obvious to those skilled in the art that any modifications, equivalents, and the like made within the spirit and principles of the present application should be included in the scope of the present application.

What is claimed is:

1. A flexible display screen supporting device, comprising:
   a drive component, wherein the drive component comprises a rotating shaft and a connecting rod that rotationally connected to the rotating shaft; and
   a supporting component that rotationally connected to the drive component, wherein the drive component and the supporting component are disposed in a non-display surface of the flexible display screen, the connecting rod is fixedly connected to the supporting component, and through the rotating connection between the rotating shaft and the connecting rod, the supporting component and the rotating shaft relatively rotate and move away from each other to fold or expand the flexible display screen,
   wherein the drive component further comprises:
   a fixing member, fixedly connected to the connecting rod and a folded component fixedly connected to the rotating shaft, the folded component comprising a lateral sliding supporting plate,
   wherein the fixing member has a sliding groove formed in a side surface, toward the folded component, of the fixing member;
   the lateral sliding supporting plate is disposed in the sliding groove, and during a process of folding the flexible display screen from an unfolded state to a folded state, the lateral sliding supporting plate slides, parallel to the flexible display screen, from an end of the sliding groove close to the flexible display screen to an end of the sliding groove away from the flexible display screen.

2. The flexible display screen supporting device of claim 1, wherein the drive component further comprises:
   a rotating member, rotationally connected to the rotating shaft;
   wherein the supporting component and the rotating shaft relatively rotate and move away from each other to fold or expand the flexible display screen comprises: the connecting rod drives the fixing member to move under an action of the rotating shaft, and a movement of the fixing member results in that the supporting component rotates around and moves away from the rotating shaft.

3. The flexible display screen supporting device of claim 2, wherein a slide way is set on the supporting component and the rotating member is disposed in the slide way and slides along the slide way.

4. The flexible display screen supporting device of claim 1, wherein the folded component comprises:
   a rotating supporting plate, an end of the rotating supporting plate rotationally connected to the lateral sliding supporting plate; and
   a panel fixed supporting plate, another end of the rotating supporting plate rotationally connected to the panel fixed supporting plate.

5. The flexible display screen supporting device of claim 1, wherein the sliding groove is a linear sliding groove.

6. The flexible display screen supporting device of claim 5, wherein an angle between an extension direction of the sliding groove and a plane of the flexible display screen is greater than zero degree and less than ninety degrees.

7. The flexible display screen supporting device of claim 1, wherein the fixing member includes two sliding grooves, and the two sliding grooves are parallel to each other.

8. The flexible display screen supporting device of claim 1, wherein the drive component further comprises: a shaft locking member fixedly connected to the rotating shaft.

9. The flexible display screen supporting device of claim 1, wherein the rotating shaft comprises a first rotating shaft and a second rotating shaft, which are arranged in parallel; the drive component comprises a first connecting rod rotationally connected with the first rotating shaft and a second connecting rod rotationally connected with the second rotating shaft.

10. A foldable flexible display device, comprising:
    a flexible display screen for realizing display function; and
    a screen supporting device for the flexible display screen;
    wherein a structure of the screen supporting device adopts the structure of the screen supporting device according to claim 1.

11. The foldable flexible display device of claim 10, wherein the flexible display screen comprises:
    a circuit board, disposed inside the supporting component and configured to provide a driving circuit required by the flexible display screen.

12. The foldable flexible display device of claim 11, wherein the circuit board comprises a flexible circuit board.

13. The foldable flexible display device of claim 11, wherein the flexible display screen comprises:
    a battery, disposed inside the supporting component and configured to provide power required by the circuit board.

14. The foldable flexible display device of claim 13, wherein the battery comprises a flexible battery.

* * * * *